US007794531B2

(12) United States Patent
Abys et al.

(10) Patent No.: US 7,794,531 B2
(45) Date of Patent: Sep. 14, 2010

(54) ORGANIC SOLDERABILITY PRESERVATIVE COMPRISING HIGH BOILING TEMPERATURE ALCOHOL

(75) Inventors: Joseph A. Abys, Warren, NJ (US); Shenliang Sun, Bethany, CT (US)

(73) Assignee: Enthone Inc., West Haven, CT (US)

( * ) Notice: Subject to any disclaimer, the term of this patent is extended or adjusted under 35 U.S.C. 154(b) by 537 days.

(21) Appl. No.: 11/620,857

(22) Filed: Jan. 8, 2007

(65) Prior Publication Data

US 2008/0163787 A1 Jul. 10, 2008

(51) Int. Cl.
*C23F 11/00* (2006.01)
*C23C 22/52* (2006.01)
*C23C 22/58* (2006.01)

(52) U.S. Cl. ............. 106/14.13; 106/14.05; 106/14.11; 106/14.14; 106/14.15; 106/14.16; 106/14.41; 106/14.42; 106/14.44; 148/243; 148/248; 148/282; 252/389.1; 252/389.52; 252/389.53; 427/384

(58) Field of Classification Search ............. 106/14.05, 106/14.13, 14.15, 14.16, 14.11, 14.14, 14.41, 106/14.42, 14.44; 148/243, 248, 282; 252/389.1, 252/389.52, 389.53; 427/384
See application file for complete search history.

(56) References Cited

U.S. PATENT DOCUMENTS

| | | | |
|---|---|---|---|
| 3,933,531 A | 1/1976 | Sawa et al. | |
| 4,373,656 A | 2/1983 | Parker, Jr. et al. | |
| 4,395,294 A | 7/1983 | Hobbins et al. | |
| 4,437,932 A | 3/1984 | Wong | |
| 4,617,251 A | 10/1986 | Sizensky | |
| 4,731,128 A | 3/1988 | Casullo | |
| 4,781,804 A | 11/1988 | Wolf | |
| 5,004,509 A | 4/1991 | Bristol | |
| 5,049,314 A | 9/1991 | Short | |
| 5,128,057 A | 7/1992 | Bixenman et al. | |
| 5,173,130 A | 12/1992 | Kinoshita et al. | |
| 5,308,402 A | 5/1994 | Bixenman et al. | |
| 5,348,590 A | 9/1994 | Shigemura et al. | |
| 5,362,334 A | 11/1994 | Adams et al. | |
| 5,376,189 A | 12/1994 | Kukanskis | |
| 5,435,860 A | 7/1995 | Maki et al. | |
| 5,436,279 A | 7/1995 | Grundke et al. | |
| 5,439,783 A | 8/1995 | Akiyama et al. | |
| 5,476,947 A | 12/1995 | Maki et al. | |
| 5,478,607 A | 12/1995 | Gunji et al. | |
| 5,496,590 A | 3/1996 | Maki et al. | |
| 5,498,301 A | 3/1996 | Hirao et al. | |
| 5,514,294 A | 5/1996 | Bohnert et al. | |
| 5,560,785 A | 10/1996 | Hirao et al. | |
| 5,658,611 A | 8/1997 | Ishido et al. | |
| 5,679,631 A | 10/1997 | Bohnert et al. | |
| 5,795,409 A | 8/1998 | Hirao et al. | |
| 5,858,074 A | 1/1999 | Cole et al. | |
| 6,083,860 A | 7/2000 | Matsuo et al. | |
| 6,391,523 B1 | 5/2002 | Hurditch et al. | |
| 6,524,398 B2 | 2/2003 | Arora et al. | |
| 6,524,644 B1 | 2/2003 | Wengenroth | |
| 6,635,123 B2 | 10/2003 | Cavallotti et al. | |
| 6,696,757 B2 | 2/2004 | Yunus et al. | |
| 6,730,209 B2 | 5/2004 | Abys et al. | |
| 6,751,099 B2 | 6/2004 | Vrtis et al. | |
| 6,786,391 B2 | 9/2004 | Stipp et al. | |
| 6,796,482 B2 | 9/2004 | Wetz et al. | |
| 6,815,088 B2 | 11/2004 | Cavallotti et al. | |
| 7,108,755 B2 | 9/2006 | Wetz et al. | |
| 2004/0150105 A1 | 8/2004 | Yunus et al. | |
| 2004/0169998 A1 | 9/2004 | Vrtis et al. | |
| 2005/0011400 A1 | 1/2005 | Owei et al. | |
| 2007/0075120 A1* | 4/2007 | Yang et al. .................. 228/101 |
| 2007/0120094 A1* | 5/2007 | Yang et al. ................ 252/389.2 |

FOREIGN PATENT DOCUMENTS

JP   02-208034 A   *   8/1990
SU   1708818 A1   *   1/1992

OTHER PUBLICATIONS

International Search Report, PCT/US08/50457, dated May 9, 2008, 4 pages.
Written Opinion, PCT/US08/50457, dated May 9, 2008, 7 pages.
International Preliminary Report on Patentability, PCT/US2008/050457, dated Jul. 23, 2009, 7 pages.

* cited by examiner

*Primary Examiner*—Anthony J Green
(74) *Attorney, Agent, or Firm*—Senniger Powers LLP

(57) ABSTRACT

An organic solderability preservative (OSP) composition comprising an alkyl cyclic alcohol and an azole compound having enhanced composition stability against crystallization of the azole compound.

33 Claims, No Drawings

ORGANIC SOLDERABILITY PRESERVATIVE COMPRISING HIGH BOILING TEMPERATURE ALCOHOL

FIELD OF THE INVENTION

The present invention relates to a method and composition for applying a corrosion-protecting film over a metal surface.

BACKGROUND OF THE INVENTION

In the manufacture of metal-containing components which are to be soldered, it is helpful to protect the metal from oxidation to enhance its solderability. For convenience, the following description is directed to the manufacture of printed wiring boards (PWB) or other electronic components having copper circuitry which is to be soldered and where it is desired that the copper not be oxidized or otherwise corroded prior to soldering.

The processes used today for protecting copper prior to soldering employ a protective coating deposited on the copper. This coating is used as an alternative to hot air solder leveling (HASL) and other metallic printed circuit board surface finishes. The coating provides protection against copper solderability degradation caused by various process steps in the fabrication process such as exposure to multiple heat cycles during electronic component fabrication for surface mount technology (SMT) and mixed technology PWB assembly.

Generally, copper protective coating systems utilize a number of steps including cleaning, microetching, and acid rinsing followed by the formation of a protective coating on the copper using a solution containing a protective forming agent. The protective forming agent is typically an imidazole or benzimidazole derivative, and the coating is generally termed an organic solderability preservative (OSP) coating.

A number of patents have issued in this area for processes which have attempted to solve the problems associated with providing a protective coating on copper circuitry.

U.S. Pat. No. 5,658,611 to Ishiko et al. provides an aqueous surface protection composition for PWBs containing a benzimidazole derivative and adjusted to a pH of 1-5 with a salt forming acid of a heavy metal such as copper, manganese, and zinc in an amount not higher than 50 ppm.

In U.S. Pat. No. 5,173,130 to Kinoshita et al., a process is disclosed for the surface treatment of copper which comprises immersing the surface of the copper in an aqueous solution containing a benzimidazole compound having an alkyl group of at least three carbon atoms at the 2-position and an organic acid. Similarly, in U.S. Pat. Nos. 5,498,301 and 5,560,785 to Hirao et al., a water-based surface treatment agent used to protect copper on a printed wiring board with excellent heat-resistance and moisture-resistance utilizes as an active ingredient a 2-arylimidazole compound.

In U.S. Pat. No. 5,795,409 to Hirao et al., a surface treating agent for copper is disclosed comprising an aqueous solution containing an imidazole compound or a benzimidazole compound, a complexing agent, and iron ions. It is contended that the surface treating agent forms a chemical film selectively on the surface of copper while forming no film on other metals.

In U.S. Pat. No. 5,362,334 to Adams et al., a composition and process for the surface treatment of metallic surfaces such as copper circuitry on printed circuit boards is disclosed which comprises treating the surface with an aqueous solution comprising a benzimidazole compound having either a halogenated phenyl group, a halogenated benzyl group, or a halogenated ethyl phenyl group in the 2-position.

In U.S. Pat. No. 5,376,189 to Kukanskis, a composition and process are disclosed for the treatment of metallic surfaces such as copper on printed circuit boards which comprises treating the surface with an aqueous solution comprising a benzimidazole compound which has at least one carboxylic or sulfonic acid group directly or indirectly attached to the benzimidazole compound.

A problem shared by many of these aqueous-based OSP compositions is related to the solubility of the azole compound. It has been observed that many of the azole compounds in the above-described patents, such as those comprising bulky 2-alkyl and 2-aryl substituents have low miscibility with water, which presents a problem in the preparation of the composition. In some preparation processes, lower alkyl alcohols, for example, alcohols having three or fewer carbon atoms and characterized by high volatility and low boiling point, have been employed to solubilize the azole compounds during OSP composition makeup. However, over time, many of the azole compounds crystallize. It is thought that the lower alkyl alcohols evaporate over time, rendering the azole compounds less soluble in the OSP composition. The OSP compositions become less concentrated in the azole compound, which compromises the ability of the OSP composition to form an effective protective coating over a copper substrate. Moreover, OSP compositions in which azole compounds have become sparingly soluble tend to deposit crystals on treated PWBs and on the tool parts which transfer PCBs through the production line.

SUMMARY OF THE INVENTION

Among the various aspects of the present invention may be noted an organic solderability preservative (OSP) composition having enhanced stability against crystallization of the azole compound.

Briefly, therefore, the invention is directed to a composition suitable for use in forming a corrosion-protective film over a substrate having a copper surface or a gold surface, and to an associated method involving contacting the substrate with the composition, the composition comprising (1) an alkyl cyclic alcohol, and (2) an azole derivative.

In yet another aspect, the invention is directed to a composition suitable for use in forming a corrosion-protective film over a substrate having a copper surface or a gold surface, and to an associated method involving contacting the substrate with the composition, with the composition comprising (a) a glycol-free monohydric alcohol having a boiling point of at least about 150° C., and (b) an azole derivative.

Other aspects of this invention are in part apparent and in part pointed out hereinafter.

DETAILED DESCRIPTION OF THE PREFERRED EMBODIMENT(S)

The present invention stems from the discovery of certain specifically advantageous solvents which enhance the stability of organic solderability preservative (OSP) compositions. These compositions are useful for depositing a protective organic film over copper and gold substrates. The protective organic film provides corrosion protection against solderability degradation of the copper and gold surfaces caused by exposure to multiple heat cycles during surface mount technology (SMT) and mixed technology PWB assembly.

In one embodiment, the OSP composition of the present invention comprises an alcohol having a relatively high boiling point. OSP compositions typically comprise an azole compound. The azole compound is typically hydrophobic, which tends to cause the azole compound to precipitate and/or crystallize in aqueous solution during long periods of storage or may cause crystallization of the azole compound on tool parts during OSP processing. The high boiling point alcohol acts as a supplementary solvent to water and is added to help solubilize the azole compound upon initial solution makeup and to keep the azole compound in solution over time during storage. The high boiling point alcohol also advantageously inhibits crystallization of the azole component over tool parts during OSP processing.

The low volatility, high boiling point alcohol may be chosen based on several physical and chemical properties which make it applicable for stabilizing an OSP composition for an extended duration. For example, the alcohol has both polar and non-polar characteristics such that it is capable of solubilizing the azole compound, which is typically bulky, non-polar, and sparingly soluble, and other organic compounds in the OSP composition while also being miscible with water. The alcohol preferably has a miscibility of at least about 1 g/100 mL of water, more preferably at least about 5 g/100 mL of water, even more preferably at least about 9 g/100 mL of water, such as at least about 10 g/100 mL of water. Additionally, the alcohol preferably has a relatively high boiling point, typically at least about 110° C., and preferably at least about 150° C. Alcohols having relatively high boiling points are characterized by low volatility, which is advantageous because in the particular context of the invention, the alcohol volatilizes at a low rate from the OSP composition. Therefore, the OSP composition can be easily controlled, i.e., the concentration of the azole compound can be known with some certainty because it remains soluble in the composition rather than crystallizing. Also, the alcohol has a high flash point which has environmental and safety advantages. Finally, the alcohol is preferably monohydric, which means that the alcohol has one hydroxyl group. Accordingly, the supplementary high boiling point alcohol of the OSP compositions of the present preferably excludes glycols (i.e., alcohols having two hydroxyl groups), triols, and compounds having four or more hydroxyl groups. Among other advantages, monohydric alcohols are characterized by reduced reactivity with other components of the OSP composition. Exemplary high boiling point alcohols for use in the OSP compositions of the present invention include those having four or more carbon atoms, such as 1-butanol, 1-pentanol, 2-pentanol, other pentanols, 1-hexanol, other hexanols, heptanols, furfuryl alcohol, and tetrahydrofurfuryl alcohol.

In one embodiment, the OSP composition comprises an alkyl cyclic alcohol which not only renders the azole component soluble in the OSP composition upon makeup, but also maintains the solubility of the component over time (i.e., during storage and during OSP processing), thus substantially inhibiting and even preventing crystallization of the azole component during shipping, storage, and processing. The OSP compositions of the present invention are useful for OSP processing without observed crystallization for as long as one month and may be used to process about 800 ft² of surface area (i.e., about 75 m² of surface area) per liter OSP working solution.

The alkyl cyclic alcohol may be chosen based on several physical and chemical properties that make it applicable for stabilizing an OSP composition for an extended duration. For example, the alkyl cyclic alcohol has both polar and non-polar characteristics such that it is capable of solubilizing the azole compound and other organic compounds in the OSP composition while also being miscible with water. The alkyl cyclic alcohol preferably has a miscibility of at least about 1 g/100 mL of water, more preferably at least about 5 g/100 mL of water, even more preferably at least about 9 g/100 mL of water, such as at least about 10 g/100 mL of water.

The alkyl cyclic alcohol is preferably capable of solubilizing the organic components of the OSP composition at relatively low concentrations. For example, it is preferred that the alkyl cyclic alcohol is capable of dissolving the organic components, including the azole compound, at a concentration as low as about 0.5 mL/L, such as about 1.0 mL/L. For example, the alkyl cyclic alcohol solubilizes the azole compound in concentrations between about 0.5 mL/L and about 2.0 mL/L in the OSP composition. Additionally, the alkyl cyclic alcohol preferably has a relatively high boiling point, typically at least about 110° C., and preferably at least about 150° C. Alkyl cyclic alcohols having relatively high boiling points are characterized by low volatility, which is advantageous because in the particular context of the invention, the alkyl cyclic alcohol volatilizes at a low rate from the OSP composition. Therefore, the OSP composition can be easily controlled, i.e., the concentration of the azole compound can be known with some certainty because it remains soluble in the composition rather than crystallizing. Also, the alkyl cyclic alcohol has a high flash point for environmental and safety advantages.

The alkyl cyclic alcohol for use in the OSP composition comprises a cyclic moiety and a hydroxyl alkyl moiety. The cyclic moiety provides the above-described non-polar character that solubilizes the azole component while the hydroxyl alkyl moiety provides the polar character that renders the alcohol water soluble.

The cyclic moiety may be aromatic or non-aromatic. The cyclic group may be heterocyclic or homocyclic. In general, the cyclic moiety has a five-membered ring, and the alkyl cyclic alcohol can have the general structure (I):

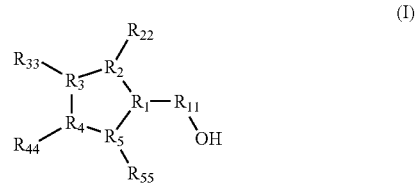

wherein $R_1$, $R_2$, $R_3$, $R_4$, and $R_5$ are carbon, nitrogen, oxygen, or sulfur; at least four of $R_1$, $R_2$, $R_3$, $R_4$, and $R_5$ are carbon; $R_{11}$ is hydrocarbyl having one, two, or three carbon; and $R_{22}$, $R_{33}$, $R_{44}$, and $R_{55}$ are hydrogen or hydrocarbyl having one, two, or three carbon. Preferably, $R_1$, $R_2$, $R_3$, $R_4$, and $R_5$ are carbon or oxygen. More preferably $R_1$, $R_3$, and $R_4$ are carbon and either, but not both, of $R_2$ or $R_5$ is oxygen. The ring defined by $R_1$, $R_2$, $R_3$, $R_4$, and $R_5$ may be aromatic or non-aromatic. Preferably, $R_{11}$ is methylene. Preferably, $R_{22}$, $R_{33}$, $R_{44}$, and $R_{55}$ are hydrogen.

Exemplary alkyl cyclic alcohols having five-membered ring structure (I) for use in the OSP composition include furfuryl alcohol and tetrahydrofurfuryl alcohol. In a preferred embodiment, the alcohol for use as a supplementary solvent is tetrahydrofurfuryl alcohol.

The concentration of the high boiling point alcohol, including the above-describe alkyl cyclic alcohol, is at least about 0.5 mL/L to achieve the solubilizing effect. The concentration is typically greater than the minimum concentration, such as at least about 5 mL/L. The concentration is typically less than about 100 mL/L. In one embodiment, the concentration is between about 0.5 mL/L to about 100 mL/L, preferably between about 50 mL/L to about 100 mL/L. In one embodiment, the concentration is lower, such as between about 5 mL/L and about 25 mL/L, preferably between about 10 mL/L and about 25 mL/L. In one embodiment, the concentration is about 5 mL/L. In one embodiment, the concentration is about 10 mL/L. In one embodiment, the concentration is about 25 mL/L.

The OSP composition may additionally comprise other alcohols selected from the group tert-butyl alcohol, allyl alcohol, ethylene glycol, diethylene glycol, propylene glycol, and glycerol. In a preferred embodiment, the OSP composition is glycol-free. Experimental results to date indicate that an OSP composition that is glycol free yields a protective coating over a metal substrate having a lighter color and better cosmetic appearance than an OSP composition that contains a glycol.

The OSP compositions of the present invention additionally comprise an azole compound. The azole compound is the active, film-forming component in the organic solderability preservative compound. Under certain conditions of OSP composition pH and copper concentration, the azole compound forms a complex with copper ions in solution, which precipitate as a protective film over the metal substrate. In general, the azole compound may be selected from among pyrroles, imidazoles, pyrazoles, triazoles, indoles, benzimidazoles, indazoles, imidazo[4,5-b]pyridine, purines, and benzotriazoles. Certain azoles are preferred depending in part on the dissociation constant, K, of the azole compound with copper. For example, the dissociation constant of benzotriazole is about 8.0, which is more reactive than benzimidazole, which has a dissociation constant of about 12.0.

The azole compounds may be substituted or unsubstituted. Preferably, the azoles are substituted with relatively bulky hydrocarbyl moieties. Bulky hydrocarbyl moieties increase the azole molecular weight and its thermal resistance. Preferably, the azole has a molecular weight of at least about 200 g/mol, such as between about 200 g/mol and about 350 g/mol. In general, the azole compound can have the following structure (II):

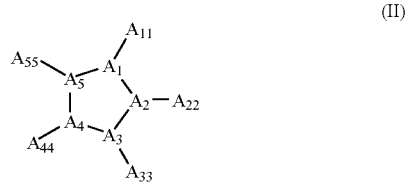

(II)

wherein $A_1$, $A_2$, $A_3$, $A_4$, and $A_5$ are either carbon or nitrogen; the number of nitrogen atoms in the 5-membered ring is one, two, or three; the 5-membered ring defined by $A_1$, $A_2$, $A_3$, $A_4$, and $A_5$ is aromatic; and $A_{11}$, $A_{22}$, $A_{33}$, $A_{44}$, and $A_{55}$ are independently selected from among an electron pair, hydrogen, halide, nitro, cyano, substituted or unsubstituted hydrocarbyl, substituted or unsubstituted alkoxy, and substituted or unsubstituted amino.

In the context of structure (II):

The halide may be chloride, bromide, or iodide. Preferably, the halide is chloride.

The substituted or unsubstituted hydrocarbyl may be selected from among substituted or unsubstituted alkyl, substituted or unsubstituted alkenyl, substituted or unsubstituted alkynyl, and substituted or unsubstituted aryl. The substituted or unsubstituted hydrocarbyl typically has from one to about twenty five carbon atoms, more typically from one to about twelve carbon atoms, such as one to about seven carbon atoms. The hydrocarbyl may be methyl, ethyl, n-propyl, isopropyl, n-butyl, isobutyl, tert-butyl, a pentyl, a hexyl, a heptyl, phenyl, or benzyl. Typical substituents on substituted hydrocarbyl include nitro, amino, halide, cyano, carbonyl, carboxyl, hydroxyl, and alkoxy. A preferred substituent is halide, which may be chloride, bromide, or iodide. Preferably, the halide substituent is chloride.

The substituted or unsubstituted alkoxy and substituted or unsubstituted amino typically have from one to about twenty five carbon atoms, more typically from one to about twelve carbon atoms, such as one to about six carbon atoms. Typical substituents on substituted alkoxy and substitued amine include nitro, amino, halide, cyano, carbonyl, carboxyl, hydroxyl, and alkoxy.

Optionally, any of the following quartets in structure (II) may together form, with the two carbon atoms to which they are bonded, a 6-membered aromatic ring:

$A_1$, $A_2$, $A_{11}$, $A_{22}$;
$A_2$, $A_3$, $A_{22}$, $A_{33}$;
$A_3$, $A_4$, $A_{33}$, $A_{44}$;
$A_4$, $A_5$, $A_{44}$, $A_{55}$; and
$A_5$, $A_1$, $A_{55}$, $A_{11}$.

In one embodiment, the azole compound is a substituted imidazole, which has the following general structure (III):

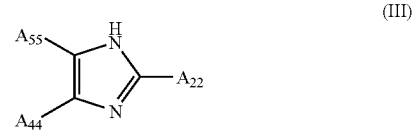

(III)

wherein $A_{22}$, $A_{44}$, and $A_{55}$ are as defined in connection with structure (II).

In one embodiment, the azole compound is a 2-substituted imidazole, which has the following general structure (IV):

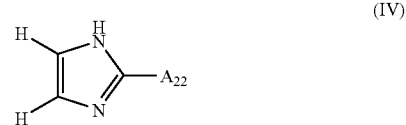

(IV)

wherein $A_{22}$ is as defined in connection with structure (II).

In one embodiment, the azole compound is a 2,4-substituted imidazole, which has the following general structure (V):

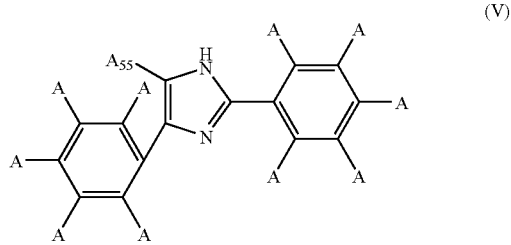

(V)

wherein $A_{55}$ may be hydrogen or methyl, and the various A groups may be hydrogen, alkyl, halide, alkoxy, alkylamino, cyano, and nitro. Preferably, the A groups are hydrogen or halide. The halide may be chloride, bromide, or iodide, and preferably, the halide is chloride.

In one embodiment, the azole compound is a benzimidazole derivative, which has the following general structure (VI):

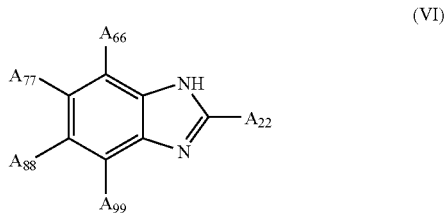

wherein $A_{22}$ is as defined in connection with structure (II); and $A_{66}$, $A_{77}$, $A_{88}$, and $A_{99}$ are independently selected from among hydrogen, halide, nitro, and substituted or unsubstituted hydrocarbyl, substituted or unsubstituted alkoxy, substituted or unsubstituted amino, and cyano.

In the context of structure (VI):

The halide may be selected from among chloride, bromide, and iodide. Preferably, the halide is chloride.

The substituted or unsubstituted hydrocarbyl may be selected from among substituted or unsubstituted alkyl, substituted or unsubstituted alkenyl, substituted or unsubstituted alkynyl, and substituted or unsubstituted aryl. The substituted or unsubstituted hydrocarbyl typically has from one to about twenty five carbon atoms, more typically from one to about twelve carbon atoms, such as one to about seven carbon atoms. The hydrocarbyl may be methyl, ethyl, n-propyl, isopropyl, n-butyl, isobutyl, tert-butyl, a pentyl, a hexyl, a heptyl, phenyl, or benzyl. Typical substituents on substituted hydrocarbyl include nitro, amino, halide, cyano, carbonyl, carboxyl, hydroxyl, and alkoxy. A preferred substituent is halide, which may be chloride, bromide, or iodide. Preferably, the halide substituent is chloride The substituted or unsubstituted alkoxy and substituted or unsubstituted amino typically have from one to about twenty five carbon atoms, more typically from one to about twelve carbon atoms, such as one to about six carbon atoms. Typical substituents on substituted alkoxy and substitued amine include nitro, amino, halide, cyano, carbonyl, carboxyl, hydroxyl, and alkoxy.

In one embodiment, the azole component is a 2-substituted benzimidazole, which has the following general structure (VII):

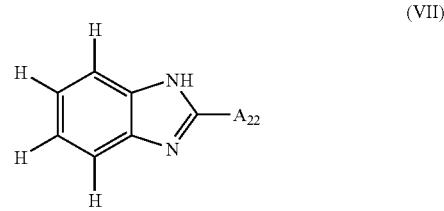

wherein $A_{22}$ is as defined in connection with structure (II).

Azole compounds are disclosed in U.S. Pat. No. 6,524,644, which is hereby incorporated in its entirety. The azole compound may be added to the OSP composition in a concentration between about 0.1 g/L and about 20 g/L, preferably from about 0.5 g/L to about 10 g/L.

The OSP composition is preferably acidic for many reasons. Among them, acidity enhances the solubility of the azole compound in the composition. Applicable acids for acidic pH adjustment include mineral acids and carboxylic acids. Preferably, the acids for acidic pH adjustment are carboxylic acids. In one embodiment, the carboxylic acids for pH adjustment are short chain carboxylic acids having alkyl chains, for example, from one to ten carbons long, preferably from one to about five carbons long. Accordingly, the OSP composition may comprise one or more carboxylic acids selected from among formic acid, acetic acid, propanoic acid, butanoic acid, pentanoic acid, hexanoic acid, heptanoic acid, and octanoic acid. In one embodiment, the OSP composition comprises more than one carboxylic acid. For example, the OSP composition may comprise a high concentration of a short chain carboxylic acid for pH adjustment, and a longer chain carboxylic acid, which has been found useful for increasing thickness of the OSP layer on the copper or gold substrate. In one embodiment, the OSP composition includes a short chain acid for pH adjustment such as formic acid and acetic acid, and a long chain fatty acid for increasing layer thickness.

In one embodiment, the concentration of acids in the OSP composition is sufficient to impart a composition pH between about 2.0 and about 6.0, preferably between about 2.8 and about 4.5, such as between about 2.9 and about 3.5. Accordingly, the carboxylic acid concentration to achieve the desired acidic pH is typically between about 50 g/L and about 300 g/L, preferably between about 50 g/L and about 200 g/L, such as about 150 g/L. Commonly known basic buffering agents may be added, when needed, to adjust the pH within a desired range. These basic buffering agents include sodium hydroxide, potassium hydroxide, and ammonium hydroxide.

The long chain carboxylic acids added to increase layer thickness may be added in lower concentrations, such as between about 0.1 g/L and about 3 g/L, preferably between about 1 g/L and about 2 g/L.

The OSP composition may additionally comprise metal ions. When the OSP composition comprising the azole component is applied to a copper surface, the azole component and copper ions from the copper surface react, forming insoluble copper-azole complexes which deposit on and form a protective organic film over the copper surface. Without being bound by a particular theory, it is thought that metal ions added to the OSP composition help to catalyze the rate of formation of the copper-azole complexes. Metal ions suitable for catalyzing the rate of formation of the copper-azole complexes include zinc(II) ions, copper(II) ions, nickel(II) ions, cobalt(II) ions, and iron(II) ions. In those embodiments where the OSP composition is used to protect a gold surface, copper (II) ion is preferably avoided because copper(II) ions may stain the gold surface. In those OSP compositions, the metal ion is preferably chosen from among zinc(II) ions, nickel(II) ions, cobalt(II) ions, and iron(II) ions. Applicants have discovered, however, that copper(II) ions may be used in the OSP compositions of the present invention for protecting gold surfaces in conjunction with the alkyl cyclic alcohols of the present invention, which advantageously reduce the extent of gold staining.

The metal ions may be provided into the OSP composition as their halide salts or as salts of organic carboxylic acids. Typically, the source of metal ions is added to the OSP composition in an amount sufficient to provide between about 0.1 g/L and about 10 g/L metal ions to the composition, preferably between about 0.5 g/L and about 5 g/L. To avoid copper ion deposition on gold substrate surfaces, which may cause the gold surface to stain, complexing agents are typically included. Applicable complexing agents are known in the art and include glycine, EDTA, ethylenediamine, and other complexing agents for each particular metal ion as are known. Typically, the complexing agent is added to the OSP composition to provide a concentration between about 0 g/L and about 33 g/L, preferably between about 0.1 g/L and about 5 g/L.

In carrying out the process of the invention, the copper or gold surface may be first prepared for treatment with the OSP composition. Accordingly, the metal surface may be cleaned and then etched. Cleaning removes trace contaminants and wets metal features on the substrate. An applicable cleaning composition is sold under the trade name Entek® Cleaner SC-1010DE, available from Enthone Inc. (West Haven, Conn.). In general, Entek® Cleaner SC-1010DE comprises commonly known surface cleaning components, such as sulfuric acid, citric acid, sodium formate, and hydrochloric acid. The cleaning composition is generally applied as a 10% v/v solution for up to about 5 minutes, preferably between 15 seconds and two minutes, such as about 60 seconds, at 38° C. After cleaning, the surface may be rinsed for between 15 seconds and 60 seconds with water at ambient temperature.

The copper or gold surface may then be etched with a microetching composition. Microetching further cleans the metal surface and roughens the surface topography. Surface roughening is advantageous because it increases the surface adhesion of the deposited OSP organic film. An applicable etching composition is sold under the trade name Entek® Microetch ME-1020, available from Enthone Inc. (West Haven, Conn.). The etching composition may contain commonly known etchants such as sodium persulfate and sulfuric acid. The etching composition generally comprises sulfuric acid, which may be present at a concentration up to about 5%, such as about 1 to 2%. The etching composition may be applied for between 15 seconds and 60 seconds at room temperature. After etching, the surface may be rinsed for between 15 seconds and 60 seconds with water at ambient temperature.

Following cleaning and etching, the copper or gold surface is ready to be treated with a pretreatment composition, the components and concentrations of which are detailed in U.S. Pat. No. 6,524,644, assigned to Enthone Inc., herein incorporated in its entirety. The pretreatment composition generally comprises an azole, such as, for example, benzimidazole, in a concentration from about 0.1 g/L to about 10 g/L, isopropanol which is used to solubilize the benzimidazole in solution, triisopropanolamine in a concentration between about 0.05 g/L and about 5 g/L, and ammonium acetate in a concentration between about 0.01 g/L and about 5 g/L. An applicable pretreatment composition is sold under the trade name Entek® Precoat PC-1030, available from Enthone Inc. (West Haven, Conn.). The pretreatment composition may be applied for about 5 seconds to about 10 minutes, preferably for between about 15 seconds to about 1 minute at ambient temperature. Applying the pretreatment composition prior to applying the OSP composition has been found to enhance the stability of the final protective OSP coating. After applying the pretreatment composition, the surface may be rinsed for between 15 seconds and 60 seconds with water at ambient temperature.

Following cleaning, etching, and application of the pretreatment composition, the copper surface is treated with the OSP composition of the present invention. The OSP composition comprises the components in the concentrations described above, including the azole component, the high boiling point alcohol, carboxylic acids, metal ions, and pH adjusting/buffering agents.

In one embodiment, the OSP composition is Entek® Plus HT (available from Enthone Inc., West Haven, Conn.) further comprising a high boiling point alcohol. In one embodiment, the high boiling point alcohol is the alkyl cyclic alcohol. The following exemplary OSP compositions may be used to protect copper and gold surfaces:

| Composition A |
|---|
| Entek ® Plus HT (prepare according to product data sheet) |
| Tetrahydrofurfuryl alcohol (5 mL/L) |
| pH adjusted to 2.9. |
| Composition B |
| Entek ® Plus HT (prepare according to product data sheet) |
| Tetrahydrofurfuryl alcohol (10 mL/L) |
| pH adjusted to 2.9. |
| Composition C |
| Entek ® Plus HT (prepare according to product data sheet) |
| Tetrahydrofurfuryl alcohol (25 mL/L) |
| pH adjusted to 2.9. |

The substrate having copper or gold surfaces is exposed to the OSP composition. This exposure may comprise dip, flood immersion, spray, or other manner of exposing the substrate to the OSP composition, with the provision that the manner of exposure adequately achieves the objective of depositing an organic film of the desired thickness and integrity. The OSP composition may be applied to the treated metal surface for between about 5 seconds to as long as about 10 minutes, preferably, the OSP composition is applied for between about 15 seconds and about 60 seconds. Exposure to the OSP composition below and above these stated durations may yield an organic film of inadequate thickness and integrity. The OSP composition may be applied at room temperature. Preferably, however, the composition is applied at higher temperature, such as between about 35° C. and about 50° C. Temperatures higher than these are preferably avoided since the short chain carboxylic acids may volatilize. After applying the OSP composition, the surface may be rinsed for between 15 seconds and 60 seconds with water at elevated temperature, which may be between about 50° C.

Finally, the substrate having metal surfaces with an organic solderability preservative film deposited thereon may be dried, such as by forced air for between about 15 seconds and about 60 seconds at a temperature of about 50° C. The corrosion protective film deposited from the OSP compositions of the present invention may be typically between about 0.1 µm and about 1.0 µm thick, such as about 0.4 µm. The film is suitably at least about 0.1 µm thick to provide adequate oxidation protection for the underlying copper or gold substrate. The film is suitably no more than about 1.0 µm thick because thicker films make it difficult for the flux to penetrate the OSP coating, prolonging wetting speeds and reducing solderability. The corrosion protective film protects the copper surface from solderability degradation until the soldering step is performed.

In one embodiment, the OSP method may be carried out according to the protocol shown in Table I.

TABLE I

OSP Film Coating Process

| Composition | Exposure Time | Temperature |
|---|---|---|
| 1. Cleaner | 1 min. | 38° C. |
| 2. Rinse | 1 min. | Ambient |
| 3. Etch | 1 min. | Ambient |
| 4. Rinse | 1 min. | Ambient |
| 5. Pretreatment composition | 30 sec. | Ambient |
| 6. Rinse | 1 min. | Ambient |
| 7. OSP composition | 1 min. | 35° C.-46° C. |

TABLE I-continued

OSP Film Coating Process

| Composition | Exposure Time | Temperature |
|---|---|---|
| 8. Deionized water rinse | 30 sec. | Ambient |
| 9. Dry, forced air | 1 min. | 50° C. |

Advantageously, the high boiling point alcohol added to the OSP composition of the present invention enhances the stability of the OSP composition against crystallization of the azole component, which can occur spontaneously during process, shipping, and storage. Moreover, the high boiling point alcohol does not deleteriously affect the quality of the organic solderability preservative film. In fact, the OSP composition comprising the high boiling point alcohol of the present invention improves the solderability of the copper or gold surface. Experimental results to date indicate that after 5× lead free reflow, wetting balance data show that the copper or gold surface preserved with the OSP composition of the present invention has better solderability than a copper or gold surface coated with conventional OSP compositions.

The following examples further illustrate the practice of the present invention.

COMPARATIVE EXAMPLE 1

Conventional OSP Compositions

Three conventional OSP compositions were prepared. The compositions were designated OSP Composition 1, OSP Composition 2, and OSP Composition 3. The OSP compositions were Entek® Plus HT, prepared according to the technical instructions provided by Enthone Inc. (West Haven, Conn.). The three OSP compositions were prepared having different formulations in terms of acid strength and concentration of transition metal ions. OSP Composition 1 had an acid strength of 95%, OSP Composition 2 had an acid strength of 80%, and OSP Composition 3 had an acid strength of 60%.

The OSP compositions were aged for three days at about 6° C. It is apparent from Table II that turbidity and precipitation caused by crystallization of the azole additive occurs within as little as one day after preparation in conventional OSP compositions.

TABLE II

Appearance of OSP Compositions

| | OSP Compositions | | |
|---|---|---|---|
| | 1 (95%) | 2 (80%) | 3 (60%) |
| Appearance before pH adjustment at Room Temperature | Moderately Turbid | Turbid | Turbid |
| Appearance after pH adjustment at Room Temperature | Moderately Turbid | Slightly Turbid | Clear |
| Appearance after 1 day at 6° C. | Turbid | Precipitate | Precipitate |
| Appearance after 2 days at 6° C. | Turbid | Precipitate | Precipitate |
| Appearance after 3 days at 6° C. | Precipitate | Precipitate | Precipitate |

EXAMPLE 2

Preparation and Composition of OSP Composition Comprising Tetrahydrofurfuryl Alcohol Three OSP compositions were prepared comprising tetrahydrofurfuryl alcohol. The base formulation was Entek® Plus HT, available from Enthone Inc. (West Haven, Conn.). In this example, the base formulation was OSP composition 1 from Example 1. Entek® Plus HT (1 L) was prepared according to the technical instructions provided by Enthone Inc. Tetrahydrofurfuryl alcohol was added prior to dilution with water to 1 L. The compositions were designated OSP Composition 4 (Entek® Plus HT with 5 mL/L tetrahydrofurfuryl alcohol), OSP Composition 5 (Entek® Plus HT with 10 mL/L tetrahydrofurfuryl alcohol), and OSP Composition 6 (Entek® Plus HT with 25 mL/L tetrahydrofurfuryl alcohol).

The three OSP compositions comprising tetrahydrofurfuryl alcohol and Enthone Inc.'s Entek® Plus HT formula were used to deposit OSP films over copper substrate. The film thicknesses achieved are shown in Table III.

TABLE III

Film Thicknesses Deposited from OSP Compositions

| Composition | Film Thickness (µm) |
|---|---|
| Entek ® Plus HT | 0.42 |
| OSP Composition 4 | 0.32 |
| OSP Composition 5 | 0.30 |
| OSP Composition 6 | 0.26 |

The appearance of OSP film deposited from OSP composition comprising tetrahydrofurfuryl alcohol was lighter, which is more favorable from a cosmetic standpoint. Additionally, the slightly thinner OSP coatings deposited from the compositions comprising alcohol while being thick enough to provide oxidation protection allow flux to more easily penetrate to the copper substrate.

The appearance of the OSP compositions 4, 5, and 6 was recorded after aging two weeks. It was observed that Composition 4 (with 5.0 mL added THFA) and Composition 5 (with 10.0 mL added THFA) exhibited slight crystallization. Composition 6 (with 25.0 mL added THFA) exhibited no crystallization even after two weeks.

EXAMPLE 3

Additional Aging Experiments of OSP Compositions Comprising Tetrahydrofurfuryl Alcohol Additional OSP compositions were prepared comprising tetrahydrofurfuryl alcohol. The base formulations were Entek® Plus HT (1 L) prepared according to the technical instructions provided by Enthone Inc. The compositions were designated OSP Composition 7 (Entek® Plus HT with 10 mL/L tetrahydrofurfuryl alcohol), OSP Composition 8 (Entek® Plus HT with 20 mL/L tetrahydrofurfuryl alcohol), and OSP Composition 9 (Entek® Plus HT with 25 mL/L tetrahydrofurfuryl alcohol). The Compositions were aged four weeks at room temperature and observed for crystallization. The results are shown in Table IV.

TABLE IV

Appearance of OSP Compositions

| | | OSP Composition | | |
|---|---|---|---|---|
| | Entek ® Plus HT | 8 | 9 | 10 |
| acid value = 252 | Precipitate | Clear | Clear | Clear |
| acid value = 268 | Slightly turbid | Clear | Clear | Clear |

In view of the above, it will be seen that the several objects of the invention are achieved and other advantageous results attained.

When introducing elements of the present invention or the preferred embodiment(s) thereof, the articles "a", "an", "the" and "said" are intended to mean that there are one or more of the elements. For example, that the foregoing description and following claims refer to "an" electrically lead means that there are one or more such leads. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense. The scope of invention is defined by the appended claims and modifications to the embodiments above may be made that do not depart from the scope of the invention.

We claim:

1. A method for forming a corrosion-protective film over a substrate having metal surfaces wherein the metal surfaces are selected from among copper surfaces, gold surfaces, and both copper and gold surfaces, the method comprising:
    contacting the substrate with a composition comprising (a) an alkyl cyclic alcohol, (b) an azole derivative and, (c) metal ions selected from the group consisting of zinc(II) ions, copper(II) ions, nickel(II) ions, cobalt(II) ions, iron (II) ions, and combinations thereof.

2. The method of claim 1 wherein the alkyl cyclic alcohol has a high boiling point of at least about 110° C.

3. The method of claim 1 wherein the alkyl cyclic alcohol has a five-membered ring having the structure (I):

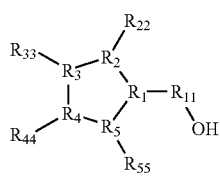

(I)

wherein $R_1$, $R_2$, $R_3$, $R_4$, and $R_5$ are carbon, nitrogen, oxygen, or sulfur; at least four of $R_1$, $R_2$, $R_3$, $R_4$, and $R_5$ are carbon; $R_{11}$ is hydrocarbyl having one, two, or three carbon; and $R_{22}$, $R_{33}$, $R_{44}$, and $R_{55}$ are hydrogen or hydrocarbyl having one, two, or three carbon.

4. The method of claim 1 wherein the alkyl cyclic alcohol is tetrahydrofurfuryl alcohol or furfuryl alcohol.

5. The method of claim 1 wherein the azole derivative has the structure (II):

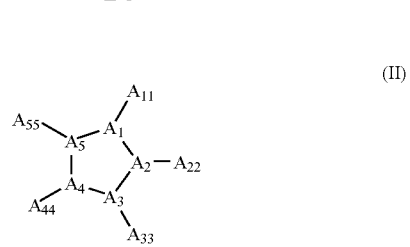

(II)

wherein $A_1$, $A_2$, $A_3$, $A_4$, and $A_5$ are either carbon or nitrogen; the number of nitrogen atoms in the 5-membered ring is one, two, or three; the 5-membered ring defined by $A_1$, $A_2$, $A_3$, $A_4$, and $A_5$ is aromatic; and $A_{11}$, $A_{22}$, $A_{33}$, $A_{44}$, and $A_{55}$ are independently selected from among an electron pair, hydrogen, halide, nitro, cyano, substituted or unsubstituted hydrocarbyl, substituted or unsubstituted alkoxy, and substituted or unsubstituted amino.

6. The method of claim 1 wherein the alkyl cyclic alcohol is present in an initial concentration of between about 0.5 and about 100 mL/L.

7. The method of claim 1 wherein the alkyl cyclic alcohol is present in an initial concentration of between about 0.5 mL/L and about 100 mL/L and the azole derivative is present in an initial concentration of between about 0.1 g/L and about 20 g/L.

8. The method of claim 1 wherein the alkyl cyclic alcohol is present in an initial concentration of between about 5 mL/L and about 25 mL/L and the azole derivative is present in an initial concentration of between about 0.5 g/L and about 10 g/L.

9. The method of claim 1 wherein the composition is glycol free.

10. The method of claim 1 wherein the metal ions are zinc(II) ions.

11. The method of claim 1 wherein the metal ions are copper(II) ions.

12. The method of claim 1 wherein the metal ions are nickel(II) ions.

13. The method of claim 1 wherein the metal ions are cobalt(II) ions.

14. The method of claim 1 wherein the metal ions are iron(II) ions.

15. A composition suitable for use in forming a corrosion-protective film over a substrate having metal surfaces wherein the metal surfaces are selected from among copper surfaces, gold surfaces, and both copper and gold surfaces, the composition consisting essentially of:
    (1) an alkyl cyclic alcohol present in a concentration of between about 0.5 and 100 mL/L;
    (2) an azole derivative;
    (3) zinc(II) ions; and
    (4) water.

16. The composition of claim 15 wherein the alkyl cyclic alcohol has a high boiling point of at least about 110° C.

17. The composition of claim 15 wherein the alkyl cyclic alcohol has a five-membered ring having the structure (I):

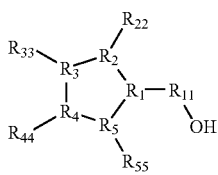

wherein $R_1$, $R_2$, $R_3$, $R_4$, and $R_5$ are carbon, nitrogen, oxygen, or sulfur; at least four of $R_1$, $R_2$, $R_3$, $R_4$, and $R_5$ are carbon; $R_{11}$ is hydrocarbyl having one, two, or three carbon; and $R_{22}$, $R_{33}$, $R_{44}$, and $R_{55}$ are hydrogen or hydrocarbyl having one, two, or three carbon.

18. The composition of claim 15 wherein the alkyl cyclic alcohol is tetrahydrofurfuryl alcohol or furfuryl alcohol.

19. The composition of claim 15 wherein the azole derivative has the structure (II):

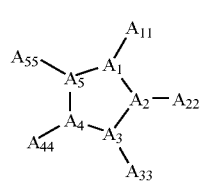

wherein $A_1$, $A_2$, $A_3$, $A_4$, and $A_5$ are either carbon or nitrogen; the number of nitrogen atoms in the 5-membered ring is one, two, or three; the 5-membered ring defined by $A_1$, $A_2$, $A_3$, $A_4$, and $A_5$ is aromatic; and $A_{11}$, $A_{22}$, $A_{33}$, $A_{44}$, and $A_{55}$ are independently selected from among an electron pair, hydrogen, halide, nitro, cyano, substituted or unsubstituted hydrocarbyl, substituted or unsubstituted alkoxy, and substituted or unsubstituted amino.

20. The composition of claim 15 wherein the azole derivative is present in a concentration of between about 0.1 g/L and about 20 g/L.

21. The composition of claim 15 wherein the alkyl cyclic alcohol is present in a concentration of between about 5 mL/L and about 25 mL/L and the azole derivative is present in a concentration of between about 0.5 g/L and about 10 g/L.

22. The composition of claim 15 wherein the composition is glycol free.

23. A method for forming a corrosion-protective film over a substrate having metal surfaces wherein the metal surfaces are selected from among copper surfaces, gold surfaces, and both copper and gold surfaces, the method comprising:
    contacting the substrate having the copper surface with a composition comprising (a) a glycol-free monohydric alcohol having a boiling point of at least about 150° C., (b) an azole derivative and, (c) metal ions selected from the group consisting of zinc(II) ions, copper(II) ions, nickel(II) ions, cobalt(II) ions, iron(II) ions, and combinations thereof.

24. A composition suitable for use in forming a corrosion-protective film over a substrate having metal surfaces wherein the metal surfaces are selected from among copper surfaces, gold surfaces, and both copper and gold surfaces, the composition comprising:
    (1) a glycol-free monohydric alcohol having a boiling point of at least about 150° C.;
    (2) an azole derivative;
    (3) metal ions selected from the group consisting of zinc (II) ions, copper(II) ions, nickel(II) ions, cobalt(II) ions, iron(II) ions, and combinations thereof; and
    (4) a carboxylic acid selected from the group consisting of formic acid, acetic acid, and a combination thereof.

25. A composition suitable for use in forming a corrosion-protective film over a substrate having metal surfaces wherein the metal surfaces are selected from among copper surfaces, gold surfaces, and both copper and gold surfaces, the composition consisting essentially of:
    (1) an alkyl cyclic alcohol;
    (2) an azole derivative;
    (3) zinc(II) ions;
    (4) water; and
    (5) a complexing agent selected from the group consisting of glycine, EDTA, ethylenediamine, and combinations thereof.

26. A composition suitable for use in forming a corrosion-protective film over a substrate having metal surfaces wherein the metal surfaces are selected from among copper surfaces, gold surfaces, and both copper and gold surfaces, the composition comprising:
    (1) an alkyl cyclic alcohol;
    (2) an azole derivative; and
    (3) copper(II) ions.

27. A composition suitable for use in forming a corrosion-protective film over a substrate having metal surfaces wherein the metal surfaces are selected from among copper surfaces, gold surfaces, and both copper and gold surfaces, the composition comprising:
    (1) an alkyl cyclic alcohol;
    (2) an azole derivative; and
    (3) nickel(II) ions.

28. A composition suitable for use in forming a corrosion-protective film over a substrate having metal surfaces wherein the metal surfaces are selected from among copper surfaces, gold surfaces, and both copper and gold surfaces, the composition comprising:
    (1) an alkyl cyclic alcohol;
    (2) an azole derivative; and
    (3) cobalt(II) ions.

29. A composition suitable for use in forming a corrosion-protective film over a substrate having metal surfaces wherein the metal surfaces are selected from among copper surfaces, gold surfaces, and both copper and gold surfaces, the composition comprising:
    (1) an alkyl cyclic alcohol;
    (2) an azole derivative; and
    (3) iron(II) ions.

30. A composition suitable for use in forming a corrosion-protective film over a substrate having metal surfaces wherein the metal surfaces are selected from among copper surfaces, gold surfaces, and both copper and gold surfaces, the composition comprising:
    (1) an alkyl cyclic alcohol;
    (2) an azole derivative;
    (3) zinc(II) ions;
    (4) water; and
    (5) a carboxylic acid selected from the group consisting of formic acid, acetic acid, and a combination thereof.

31. The composition of claim 30 further comprising a carboxylic acid selected from the group consisting of propanoic acid, butanoic acid, pentanoic acid, hexanoic acid, heptanoic acid, octanoic acid, and combinations thereof.

32. A composition suitable for use in forming a corrosion-protective film over a substrate having metal surfaces wherein the metal surfaces are selected from among copper surfaces, gold surfaces, and both copper and gold surfaces, the composition comprising:
    (1) an alkyl cyclic alcohol in a concentration between about 0.5 mL/L and about 25 mL/L;

(2) an azole derivative;
(3) zinc(II) ions; and
(4) water.

33. The composition of claim 32 further comprising a carboxylic acid selected from the group consisting of formic acid, acetic acid, propanoic acid, butanoic acid, pentanoic acid, hexanoic acid, heptanoic acid, octanoic acid, and combinations thereof.

* * * * *